United States Patent
Li

(10) Patent No.: US 11,322,199 B1
(45) Date of Patent: May 3, 2022

(54) COMPUTE-IN-MEMORY (CIM) CELL CIRCUITS EMPLOYING CAPACITIVE STORAGE CIRCUITS FOR REDUCED AREA AND CIM BIT CELL ARRAY CIRCUITS

(71) Applicant: QUALCOMM Incorporated, San Diego, CA (US)

(72) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/067,205

(22) Filed: Oct. 9, 2020

(51) Int. Cl.
G11C 11/419 (2006.01)
G11C 11/409 (2006.01)
G11C 11/404 (2006.01)

(52) U.S. Cl.
CPC .......... *G11C 11/419* (2013.01); *G11C 11/409* (2013.01); *G11C 11/4045* (2013.01)

(58) Field of Classification Search
CPC .......................... G11C 11/4045; G11C 11/409
USPC ........................................................ 365/149
See application file for complete search history.

(56) References Cited

U.S. PATENT DOCUMENTS

| | | | |
|---|---|---|---|
| 5,784,311 A | 7/1998 | Assaderaghi et al. | |
| 2004/0195593 A1* | 10/2004 | Diorio | G11C 16/3486 257/202 |
| 2007/0217260 A1 | 9/2007 | Kitagawa | |
| 2015/0187775 A1 | 7/2015 | Yamamoto et al. | |
| 2018/0061477 A1* | 3/2018 | Kawamura | G11C 7/062 |
| 2019/0026628 A1 | 1/2019 | Tanaka et al. | |
| 2019/0138893 A1 | 5/2019 | Sharma et al. | |
| 2019/0333567 A1 | 10/2019 | Giterman et al. | |
| 2020/0279850 A1* | 9/2020 | Sharma | G11C 5/025 |

OTHER PUBLICATIONS

Li, H. et al., "Novel 2T Gain Cell with Enhanced Retention Time for Embedded DRAM Application", International Conference on Solid-State and Integrated Circuit Technology, Guilin, China, 2014, 3 Pages.
International Search Report and Written Opinion for International Patent Application No. PCT/US2021/044317, dated Nov. 12, 2021, 14 pages.

* cited by examiner

*Primary Examiner* — Anthan Tran
(74) *Attorney, Agent, or Firm* — Qualcomm Incorporated

(57) ABSTRACT

A CIM bit cell circuit employing a capacitive storage circuit to store a binary weight data as a voltage occupies half or less of the area of a 6T SRAM CIM bit cell circuit, reducing the increase in area incurred in the addition of a CIM bit cell array circuit to an IC. The CIM bit cell circuit includes a capacitive storage circuit that stores binary weight data in a capacitor and generates a product voltage indicating a binary product resulting from a logical AND-based operation of the stored binary weight data and an activation signal. The capacitive storage circuit may include a capacitor and a read access switch or a transistor. The CIM bit cell circuit includes a write access switch to couple a write bit voltage to the capacitive storage circuit. In a CIM bit cell array circuit, the product voltages are summed in a MAC operation.

13 Claims, 10 Drawing Sheets

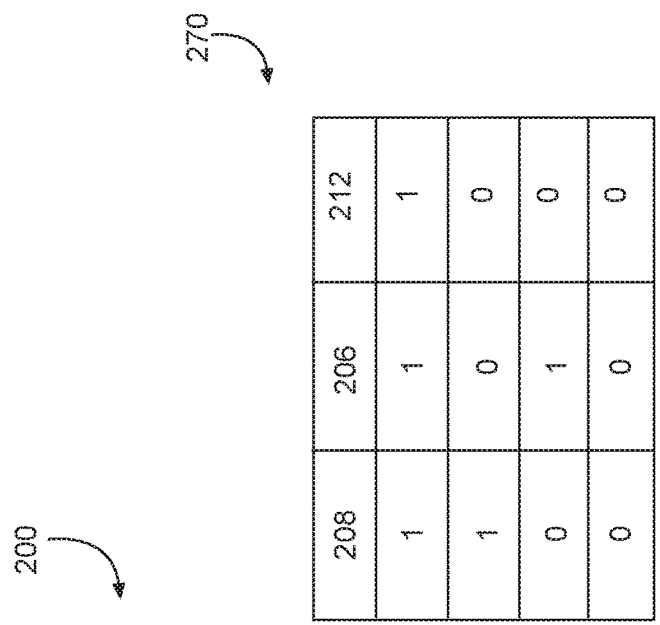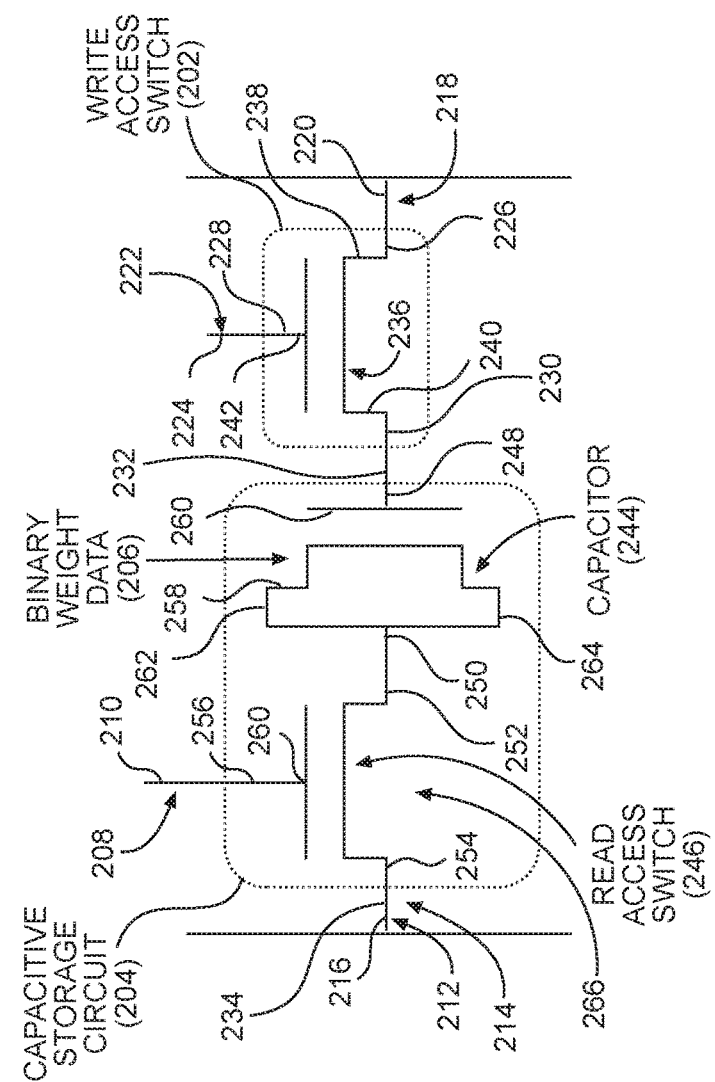

COMPUTE-IN-MEMORY (CIM) CELL CIRCUITS EMPLOYING CAPACITIVE STORAGE CIRCUITS FOR REDUCED AREA AND CIM BIT CELL ARRAY CIRCUITS

BACKGROUND

I. Field of the Disclosure

The field of the disclosure relates generally to compute-in-memory (CIM) arrays used in circuits for high-speed parallel data processing, such as neural networks.

II. Background

Machine learning is an example of artificial intelligence (AI). In an initial learning phase, a computer configured with machine learning receives a set of known input data and performs an evaluation of the input data. Evaluations of input data can include thousands of calculations in which individual inputs are weighted based on weight data stored in computer memory. Indications of the correctness of the evaluations are provided as feedback and the computer modifies the stored weight data in response to the feedback. The computer uses the modified weight data to evaluate new data. As more feedback is received, the evaluation results become more accurate.

In a conventional computer, each calculation requires input data and weight data to be transferred from memory and then generates output data that is transferred to memory. When a computer attempts to perform many calculations in parallel, a data transfer bottleneck between the processing circuits and memory causes the processing circuits to be starved for data, which extends execution time and increases power consumption.

In an alternative approach, specialized processing circuits in computers can perform many multiply and accumulate operations in parallel. These operations can be effectively implemented by a neural network framework made up of arrays of nodes organized in a structure similar to brain synapses. These processing nodes each perform a multiply-accumulate (MAC) operation in which each input is multiplied by a corresponding weight data and the resulting products are summed. FIG. 1 is an illustration of a node 100 of a neural network configured to perform a MAC operation. The node 100 receives a set of inputs $X_0$-$X_M$ that are each multiplied by a corresponding one of weight values $W_0$-$W_M$. The weight values $W_0$-$W_M$ are based on feedback from previous calculations and improve the accuracy of calculations regarding a particular type of input data over time. The products of the multiplications are respective products $P_0$-$P_M$. The products $P_0$-$P_M$ are added to generate a sum SUM, and the node 100 generates an output OUT that is a function AF (e.g., activation function) of the sum SUM.

Compute-in-memory (CIM) arrays were developed to implement a node of a neural network framework that performs MAC operations on one-bit binary numbers and reduces the data transfer bottleneck to generate a result more quickly. A CIM array stores a bit of binary weight data within a bit cell of a CIM array and also performs a multiply operation of the weight data and an input data. A multiply of one-bit binary values may be implemented as a logical AND-based operation (e.g., AND or Not AND (NAND)). Each CIM bit cell includes circuits to store a weight data bit and to perform a multiplication. When a neural network including a CIM array is employed in a processing circuit to reduce a data bottleneck, the increase in processing speed is at the expense of an increase in the area of an integrated circuit (IC) occupied by the CIM bit cell circuits.

SUMMARY OF THE DISCLOSURE

Aspects disclosed herein include compute-in-memory (CIM) bit cell circuits employing capacitive storage circuits for reduced area. CIM bit cell array circuits employing the CIM bit cell circuits and methods of operating such CIM bit cell array circuits are also disclosed. Employing a CIM bit cell array circuit to execute a plurality of multiply-accumulate (MAC) operations in parallel in a neural network reduces execution time compared to executing each of the individual calculations of a MAC operation in a conventional processor, but the area occupied by a CIM bit cell array circuit increases the size of an integrated circuit (IC). A six-transistor (6T) static random-access memory (SRAM) bit cell circuit has been previously employed in CIM bit cell circuits. In exemplary aspects, a CIM bit cell circuit employing a capacitive storage circuit to store a binary weight data as a voltage occupies half or less of the area of a 6T SRAM bit cell circuit, reducing the increase in area incurred in the addition of a CIM bit cell array circuit to an IC. The capacitive storage circuit is configured to store the binary weight data in a capacitor and generate a product voltage indicating a binary product resulting from a logical AND-based operation of the stored binary weight data and an activation signal. The CIM bit cell circuit includes a write access switch configured to couple a write bit voltage to the capacitive storage circuit. The capacitive storage circuit is configured to store the binary weight data as a charge based on the write bit voltage and generate the product voltage on a read bit output based on the stored binary weight data and an activation signal. In examples, the capacitive storage circuit may include a capacitor and a read access switch or a transistor.

In this regard, in one aspect, a CIM bit cell circuit is disclosed. The CIM bit cell circuit includes a write access switch. The write access switch includes an input terminal coupled to a write bit input. The write access switch also includes a control terminal coupled to a write word input. The write access switch also includes an output terminal. The write access switch is configured to couple the write bit input to the output terminal in response to a write word voltage supplied to the write word input. The CIM bit cell circuit also includes a capacitive storage circuit. The capacitive storage circuit includes a first port coupled to the output terminal of the write access switch. The capacitive storage circuit also includes a second port coupled to a read bit output. The capacitive storage circuit is configured to store a weight data based on a write bit voltage supplied on the write bit input in response to the write word voltage supplied to the write word input. The capacitive storage circuit is also configured to generate a product voltage on the read bit output based on an activation signal and the stored weight data.

In another aspect, a CIM bit cell array circuit is disclosed. The CIM bit cell array circuit includes an array of CIM bit cell circuits. The array of CIM bit cell circuits also includes a plurality of rows of CIM bit cell circuits and a plurality of columns of CIM bit cell circuits. Each row of the plurality of rows includes a corresponding activation line coupled to an activation input in each of the CIM bit cell circuits in the row and a corresponding write word line coupled to a write word input in each of the CIM bit cell circuits in the row. Each column of the plurality of columns includes a corresponding write bit line coupled to a write bit input in each of the CIM bit cell circuits in the column and a corresponding read bit line coupled to a read bit output in each of the CIM bit cell circuits in the column. Each of the CIM bit cell circuits includes a write access switch. The write access switch includes an input terminal coupled to the write bit input. The write access switch also includes a control terminal coupled to the write word input. The write access switch also includes an output terminal. Each of the CIM bit cell circuits also includes a capacitive storage circuit. The capacitive storage circuit includes a first port coupled to the output terminal of the write access switch. The capacitive storage circuit also includes a second port. The capacitive storage circuit is configured to store a weight data based on a write bit voltage supplied on the write bit line in in response to a write word voltage supplied to the write word line. The capacitive storage circuit is also configured to generate a product voltage on the read bit output based on an activation signal on the activation line and the stored weight data.

BRIEF DESCRIPTION OF THE FIGURES

FIG. 2A is a schematic diagram of an exemplary three-transistor (3T) compute-in-memory (CIM) bit cell circuit including an N-type metal-oxide-semiconductor (MOS) (NMOS) Field-Effect Transistor (MOSFET) and an NMOS read access transistor in a capacitive storage circuit and that generates a logical product (AND-based operation) of an input data bit and a weight data bit stored in the capacitive storage circuit;

FIG. 2B is a truth table illustrating a logical multiplication (AND-based) operation of a stored binary weight data and an activation signal in the 3T CIM bit cell circuit in FIG. 2A;

DETAILED DESCRIPTION

Figure 1:
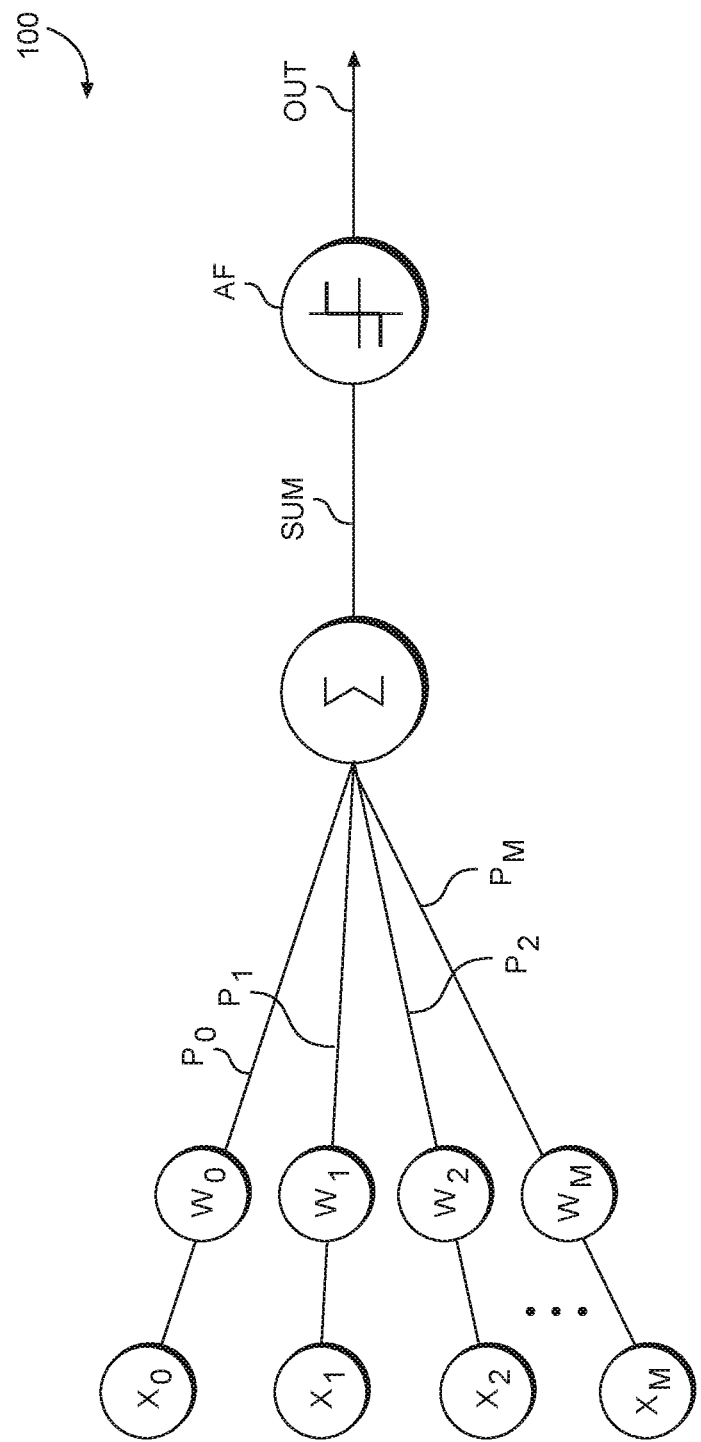
FIG. 1 is a schematic diagram of a processing node employed in a neural network to perform a multiply-accumulate (MAC) operation.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include compute-in-memory (CIM) bit cell circuits employing capacitive storage circuits for reduced area. CIM bit cell array circuits employing the CIM bit cell circuits and methods of operating such CIM bit cell array circuits are also disclosed. Employing a CIM bit cell array circuit to execute a plurality of multiply-accumulate (MAC) operations in parallel in a neural network reduces execution time compared to executing each of the individual calculations of a MAC operation in a conventional processor but the area occupied by a CIM bit cell array circuit increases the size of an integrated circuit (IC). A six-transistor (6T) static random-access memory (SRAM) bit cell circuit has been previously employed in CIM bit cell circuits. In exemplary aspects, a CIM bit cell circuit employing a capacitive storage circuit to store a binary weight data as a voltage occupies half or less of the area of a 6T SRAM bit cell circuit, reducing the increase in area incurred in the addition of a CIM bit cell array circuit to an IC. The capacitive storage circuit is configured to store the binary weight data in a capacitor and generate a product voltage indicating a binary product resulting from a logical AND-based operation of the stored binary weight data and an activation signal. The CIM bit cell circuit includes a write access switch configured to couple a write bit voltage to the capacitive storage circuit. The capacitive storage circuit is configured to store the binary weight data as a charge based on the write bit voltage and generate the product voltage on a read bit output based on the stored binary weight data and an activation signal. In examples, the capacitive storage circuit may include a capacitor and a read access switch or a transistor.

FIG. 2A is a schematic diagram of a first exemplary CIM bit cell circuit 200 for MAC operations. The CIM bit cell circuit 200 employs capacitive charge-based data storage and performs a binary multiplication in half or less of the area of a 6T SRAM-based CIM bit cell circuit. The CIM bit cell circuit 200 includes a write access switch 202 that is controlled to program a capacitive storage circuit 204 with a binary weight data 206. The CIM bit cell circuit 200 receives an activation signal 208 on an activation input 210 to control generation of a product data 212. The product data 212 is a result of a binary multiplication (e.g., logical AND-based operation) of the activation signal 208 and the binary weight data 206. The product data 212 is indicated by a product voltage 214 generated on a read bit output 216.

The capacitive storage circuit 204 stores the binary weight data 206 as an electrical charge based on a write bit voltage 218. The write bit voltage 218 is supplied on a write bit input 220 and provided to the capacitive storage circuit 204 through the write access switch 202 in response to a write word voltage 222 received on a write word input 224. In this regard, the write access switch 202 includes an input terminal 226 coupled to the write bit input 220, a control terminal 228 coupled to the write word input 224, and an output terminal 230 coupled to a first port 232 of the capacitive storage circuit 204. The input terminal 226 is electrically coupled to the output terminal 230 to provide the write bit voltage 218 to the first port 232 of the capacitive storage circuit 204 in response to the write word voltage 222 supplied on the control terminal 228.

In an example, the write bit voltage 218 may be a supply voltage, $V_{DD}$, indicating that the binary weight data 206 is a binary "1" or may be a ground voltage, $V_{SS}$, indicating the binary weight data 206 is a binary "0". Alternatively, the ground voltage, $V_{SS}$, may indicate a binary "1" and the supply voltage, $V_{DD}$, may indicate a binary "0". A binary value of the activation signal 208 on the activation input 210 may be indicated in the same manner as the binary weight data 206. The CIM bit cell circuit 200 generates the product voltage 214 to indicate a binary product of a logical AND operation of the binary weight data 206 and the activation signal 208. The capacitive storage circuit 204 generates the product voltage 214 through a second port 234 coupled to the read bit output 216. The CIM bit cell circuit 200 may also be configured to generate the product voltage 214 as a product of a logical AND operation.

In the example in FIG. 2A, the write access switch 202 is an N-type metal-oxide-semiconductor (MOS) Field-Effect Transistor (FET) (N-type MOSFET) (NFET) 236. A source/drain 238 of the NFET 236 is the input terminal 226 of the write access switch 202, and a drain/source 240 of the NFET 236 is the output terminal 230. A gate 242 of the NFET 236 is the control terminal 228. In an alternative example, the write access switch 202 could be implemented as a P-type MOSFET (PFET). In general, a source/drain referred to herein may function as either a source or a drain of a FET, depending on implementation, and a drain/source refers to the other one of the drain or source of a FET. The access switch 202 may also be implemented as a bipolar junction transistor (BJT), a micro-electro-mechanical systems (MEMS) device, or other switch technology. In such alternatives, the input terminal 226, the output terminal 230, and the control terminal 228 of the write access switch 202 are implemented by appropriate terminals of such devices, and the control terminal 228 may be activated by a different signal, voltage, and/or current to electrically couple the write bit input 220 to the first port 232 of the capacitive storage circuit 204.

The capacitive storage circuit 204 includes a capacitor 244 to store the binary weight data 206 and a read access switch 246 to generate the product voltage 214. The capacitor 244 includes a first terminal 248 coupled to the first port 232. The capacitor 244 also includes a second terminal 250 coupled to an input terminal 252 of the read access switch 246. An output terminal 254 of the read access switch 246 is coupled to the second port 234 of the capacitive storage circuit 204, and a control terminal 256 of the read access switch 246 is coupled to the activation input 210 of the CIM bit cell circuit 200.

In the example in FIG. 2A, an NFET 258 is configured as the capacitor 244. A gate 260 of the NFET 258 is the first terminal 248 of the capacitor 244. A source/drain 262 of the NFET 258 and a drain/source 264 are electrically shorted to each other and also coupled to the second terminal 250 of the capacitor 244.

To write the binary weight data 206 for use in a MAC operation in the CIM bit cell circuit 200, the write access switch 202 is turned on by the write word voltage 222 supplied to write word input 224, and the activated write access switch 202 passes the write bit voltage 218 supplied on the write bit input 220 to the gate 260. In the CIM bit cell circuit 200, the NFET 236 of the write access switch 202 is turned on (e.g., to conduct between the source/drain 238 and the drain/source 240) in response to the write word voltage 222 being the supply voltage $V_{DD}$. The write bit voltage 218 charges the gate 260 to a voltage level indicating the binary weight data 206 is either a "0" or a "1". The charge on the gate 260 is reflected on the second terminal 250 of the capacitor 244. To read the product data 212 from the CIM bit cell circuit 200, the activation signal 208 supplied on the activation input 210 turns on the read access switch 246, and the product voltage 214 is generated on the read bit output 216. The read access switch 246 is turned on (e.g., to conduct between the source/drain 238 and the drain/source 240) in response to the write word voltage 222 being the supply voltage $V_{DD}$. In this regard, the read access switch 246 may be an NFET 266 or other type of electrical switch. After reading the product data 212 from the capacitive storage circuit 204, the charge representing the binary weight data 206 remains on the capacitor 244. Thus, the read operation for reading the product data 212 is non-destructive.

The NFET 258 employed as the capacitor 244 is charged based on the write bit voltage 218, but leakage currents in the NFET 258 allow the charge to slowly dissipate over time. Therefore, to maintain the charge on the NFET 258, to avoid losing the binary weight data 206 written into the CIM bit cell circuit 200, the charge on the capacitor 244 is dynamically (e.g., periodically or occasionally) refreshed by providing the same write bit voltage 218 to the write bit input 220 and activating the write access switch 202 by supplying the write word voltage 222 to the write word input 224.

Further, the read access switch 246 can be activated to read the product data 212 on the read bit output 216 simultaneously with (e.g., at the same time as) the charge on the capacitor 244 being refreshed. In this regard, the refresh operation does not cause conflicts with the product data 212 being read from the CIM bit cell circuit 200, which eliminates a need for control logic and a possibility of processing delays due to conflicts.

Referring to a truth table 270, FIG. 2B shows that the product data 212 will have a binary value of "1" only when the binary weight data 206 and the activation signal 208 both have values of binary "1". Otherwise, the product data 212 will have a value of binary "0". Thus, the CIM bit cell circuit 200 performs a binary multiplication of the stored binary weight data 206 and the activation signal 208 to produce the product data 212.

The write access switch 202 is also implemented by the NFET 266. Thus, the CIM bit cell circuit 200 includes only three (3) transistors (i.e., the write access switch 202, the capacitor 244, and the read access switch 246), which are all NFETs in this example. The three NFETs of the CIM bit cell circuit 200 occupy approximately half of the area occupied by a 6T SRAM bit cell circuit that has previously been employed in CIM circuits. The capacitively stored binary weight data 206 needs to be periodically refreshed due to leakage of the charge stored in the capacitor 244, but the 50% reduction in area from an SRAM-based circuit is an acceptable tradeoff to IC designers who are constantly trying to reduce IC area. An IC employing a plurality of the CIM bit cell circuit 200 in FIG. 2A as neural network processing circuits would result in a smaller increase in size compared to employing neural network processing circuits formed of 6T SRAM bit cells circuits, which reduces IC costs.

In addition, the CIM bit cell circuit 200 in which the electrical components are MOSFETs can be fabricated without special processes that would be required to employ embedded dynamic random-access memory (DRAM) on an IC with MOSFET-based logic circuits. Consequently, a reduced area CIM processing circuit is provided without additional processing steps.

Figure 3:
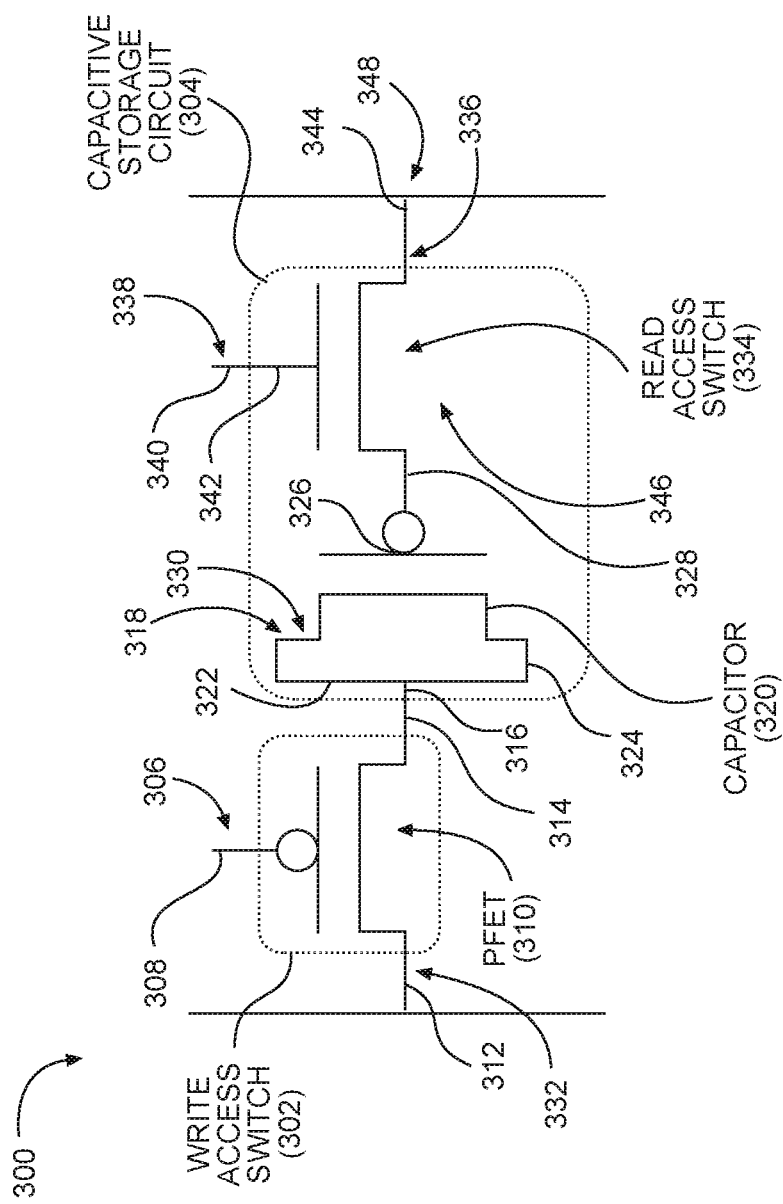
FIG. 3 is a schematic diagram of an exemplary 3T CIM bit cell circuit including a P-type MOS (PMOS) FET (MOSFET) and a PMOS read access transistor circuit in a capacitive storage circuit.

As noted above, the write access switch 202 and the capacitive storage circuit 204 in FIG. 2A both employ N-type MOSFETs (i.e., NFET 236 and NFET 258, respectively). A schematic diagram of an alternative CIM bit cell circuit 300 is illustrated in FIG. 3. The CIM bit cell circuit 300 employs capacitive charge-based data storage and performs a binary multiplication in half or less of the area of a 6T SRAM-based CIM bit cell circuit. The CIM bit cell circuit 300 includes a write access switch 302 to control programming of a capacitive storage circuit 304. The CIM bit cell circuit 300 is identical in operation to the CIM bit cell circuit 200 of FIG. 2A except with respect to a write word voltage 306 supplied to a write word input 308 to turn on the write access switch 302. In the CIM bit cell circuit 300, the write access switch 302 employs a P-type MOSFET (PFET) 310, which is activated by the write word voltage 306 being the ground voltage $V_{SS}$, as opposed to the supply voltage $V_{DD}$, supplied to the write word input 224 in FIG. 2A. The write access switch 302 couples a write bit input 312 to a first port 314 of the capacitive storage circuit 304 in response to the write word voltage 306 on the write word input 308. The first port 314 of the capacitive storage circuit 304 is coupled to a first terminal 316 of a PFET 318, which is employed as a capacitor 320. In the capacitive storage circuit 304, a source/drain 322 and a drain/source 324 of the PFET 318 are coupled to the first terminal 316, and a gate 326 of the PFET 318 is coupled to a second terminal 328. The capacitor 320 is electrically charged to store a binary weight data 330 based on a write bit voltage 332 supplied on the write bit input 312.

A read access switch 334 in the capacitive storage circuit 304 couples the second terminal 328 of the capacitor 320 to a second port 336 of the capacitive storage circuit 304 in response to an activation signal 338 on an activation input 340. The activation input 340 is coupled to a control terminal 342 of the read access switch 334. The second port 336 is further coupled to a read bit output 344. The read access switch 334 is an NFET 346 corresponding to the NFET 266 in FIG. 2. A product data 348 generated on the read bit output 344 is a binary result of a logical AND of the binary weight data 330 and the activation signal 338.

Figure 4:
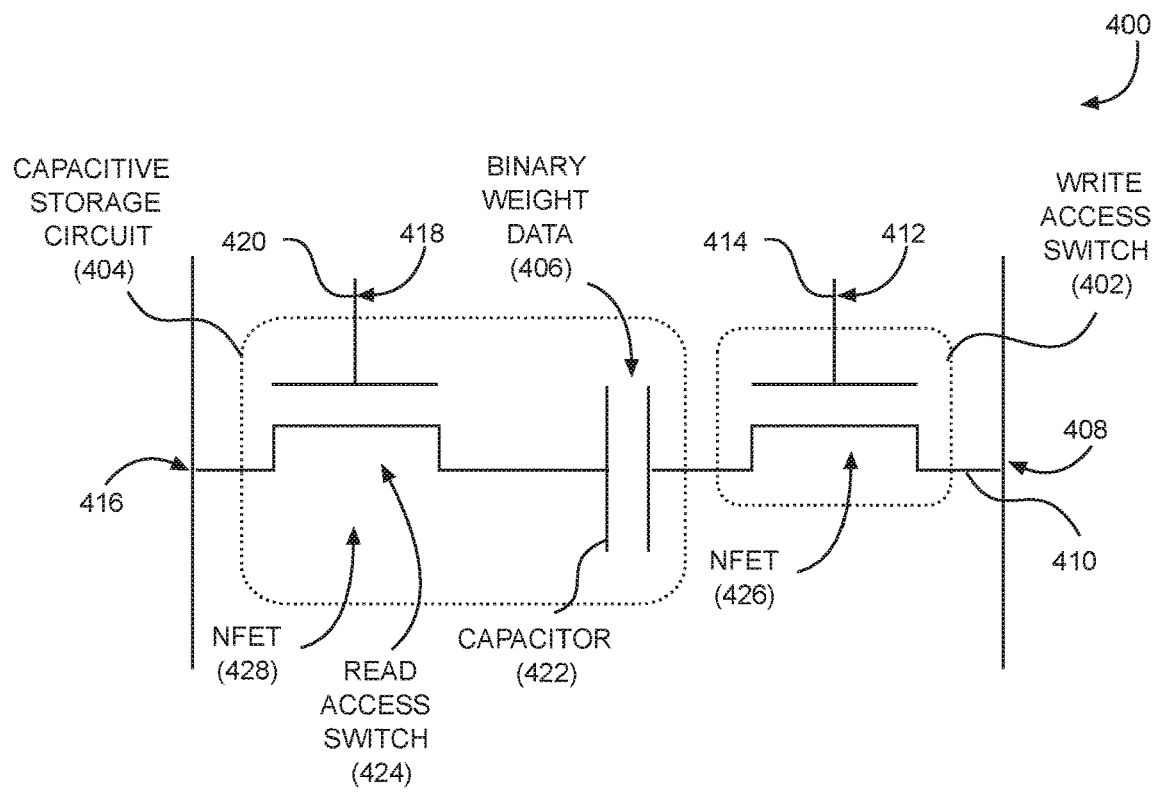
FIG. 4 is a schematic diagram of an exemplary two-transistor (2T) one-capacitor (1C) (2T1C) CIM bit cell circuit including a parallel plate capacitor and an NMOS read access transistor in a capacitive storage circuit.

In another example, a schematic diagram of a CIM bit cell circuit 400 is shown in FIG. 4. The CIM bit cell circuit 400 employs capacitive charge-based data storage and performs binary multiplication in half or less of the area of a 6T SRAM-based CIM bit cell circuit. The CIM bit cell circuit 400 includes a write access switch 402 to control programming of a capacitive storage circuit 404. Operation of the CIM bit cell circuit 400 is identical to operation of the CIM bit cell circuit 200 of FIG. 2A. That is, the CIM bit cell circuit 400 stores a binary weight data 406 based on a write bit voltage 408 on a write bit input 410 in response to a write word voltage 412 on a write word input 414. In addition, a product data 416 is generated by a logical AND operation of the binary weight data 406 and an activation signal 418 on an activation input 420.

The CIM bit cell circuit 400 is structurally equivalent to the CIM bit cell circuit 200, except with regard to the capacitive storage circuit 404 which employs a capacitor 422 in the place of the NFET 258 employed in the capacitive storage circuit 204 in FIG. 2A. The CIM bit cell circuit 400 is also functionally equivalent to the CIM bit cell circuit 200. The capacitor 422 stores the binary weight data 406. The write access switch 402 and a read access switch 424 may be NFETs 426 and 428, respectively, corresponding to the NFETs 236 and 266 in FIG. 2A. The capacitor 422 may be a parallel plate capacitor or other type of capacitor formed in a front-end-of-line (FEOL) process or a back-end-of-line (BEOL) process. The CIM bit cell circuit 400 according to the present disclosure may alternatively include another capacitor structure other than the parallel plate capacitor 422.

Figure 5:
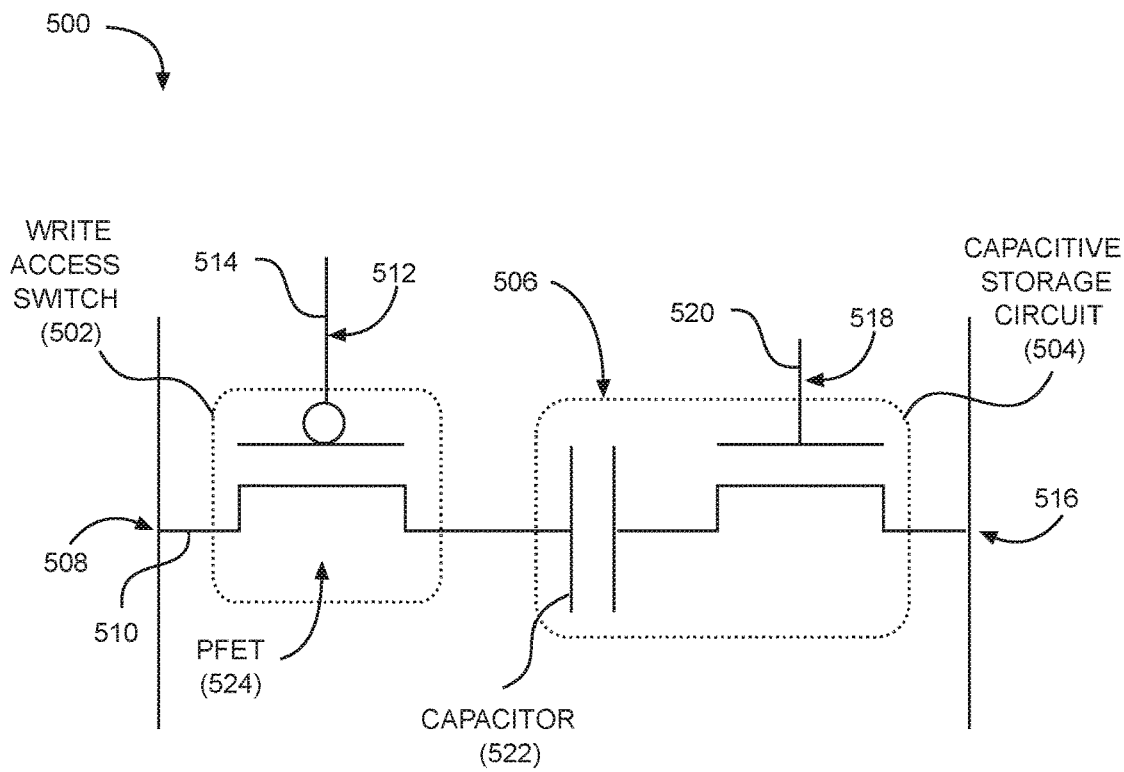
FIG. 5 is a schematic diagram of an exemplary 2T1C CIM bit cell circuit including a parallel plate capacitor and a PMOS read access transistor in a capacitive storage circuit.

In another example, a schematic diagram of a CIM bit cell circuit 500 is shown in FIG. 5. The CIM bit cell circuit 500 also employs capacitive charge-based data storage in half or less of the area of a 6T SRAM-based CIM bit cell circuit. The CIM bit cell circuit 500 includes a write access switch 502 to control programming of a capacitive storage circuit 504. Operation of the CIM bit cell circuit 500 is identical to operation of the CIM bit cell circuit 300 of FIG. 3. That is, the CIM bit cell circuit 500 stores a binary weight data 506 based on a write bit voltage 508 supplied on a write bit input 510 in response to a write word voltage 512 supplied on a write word input 514. A product data 516 is generated by a logical AND operation of the binary weight data 506 and an activation signal 518 supplied on an activation input 520. The CIM bit cell circuit 500 is structurally equivalent to the CIM bit cell circuit 300, except that the capacitive storage circuit 504 employs a capacitor 522 in the place of the PFET 318 employed in the capacitive storage circuit 304 in FIG. 3. The capacitor 522 may be a parallel plate capacitor or other type of capacitor formed in a FEOL process or BEOL process. Like the PFET 310 in the write access switch 302 in FIG. 3, the write access switch 502 includes a PFET 524 that is activated (e.g., the switch is closed) by the write word voltage 512 being the ground voltage $V_{SS}$ supplied to the write word input 514.

Figure 6:
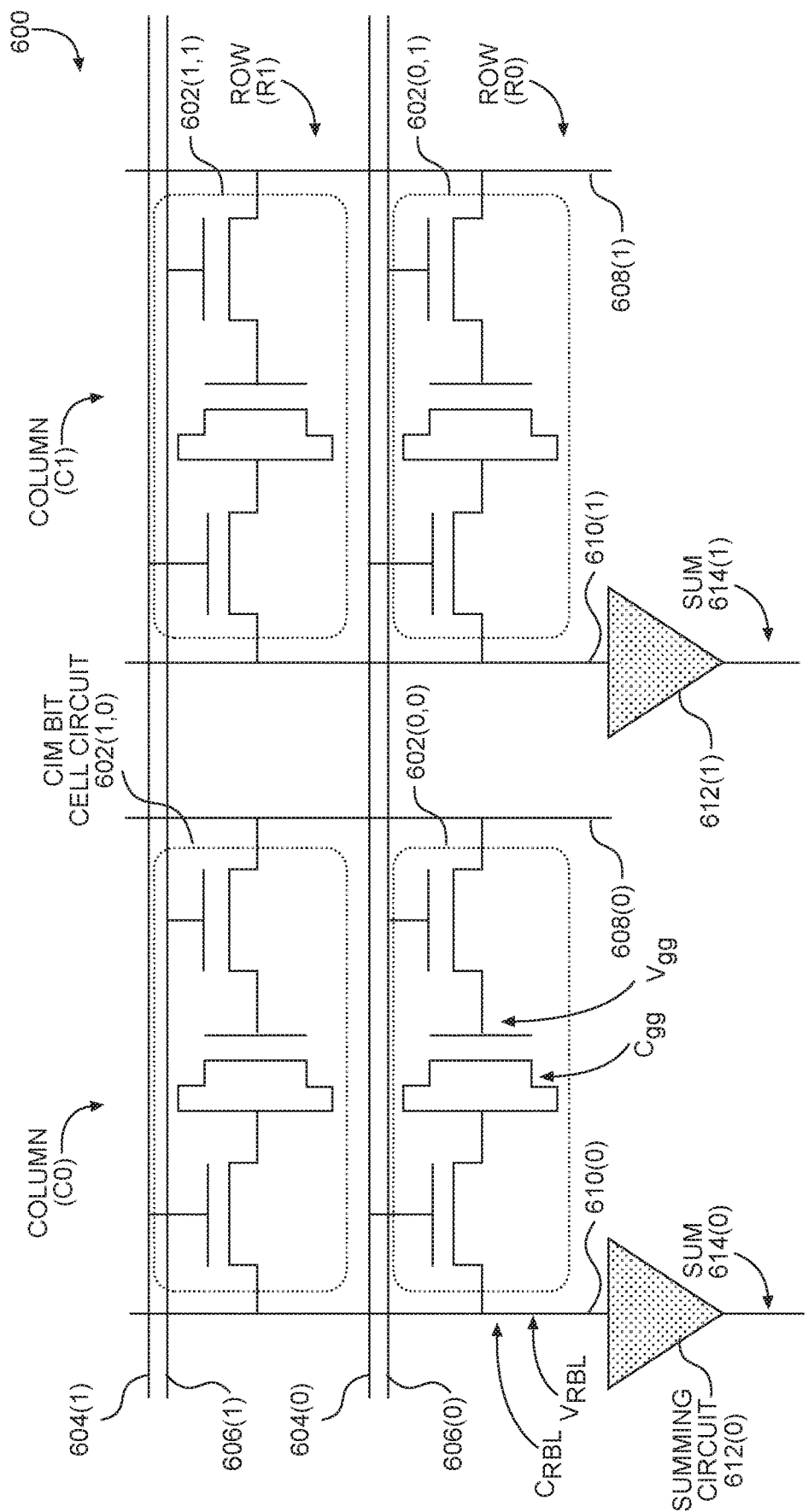
FIG. 6 is a schematic diagram of a 2×2 array of a plurality of the 3T CIM bit cell circuit in FIG. 2, and includes summing circuits in each column of the 2×2 array.

FIG. 6 is a schematic diagram of a CIM bit cell array circuit (CIM array circuit) 600 of CIM bit cell circuits 602(0,0)-602(1,1), referred to collectively as CIM bit cell circuits 602. The CIM bit cell circuits 602 in the CIM array circuit 600 are the CIM bit cell circuit 200 in FIG. 2A, and the labels illustrated in FIG. 2A are cited in all references to features of the CIM bit cell circuits 602. Thus, each of the CIM bit cell circuits 602 includes an activation input 210, a write bit input 220, a write word input 224 and a read bit output 216. Each of the CIM bit cell circuits 602 stores a binary weight data 206 as described in FIG. 2A.

The CIM array circuit 600 includes row R0 with CIM bit cell circuits 602(0,0) and 602(0,1), and row R1 with CIM bit cell circuits 602(1,0) and 602(1,1). The CIM array circuit 600 also includes column C0 with CIM bit cell circuits 602(0,0) and 602(1,0), and column C1 with CIM bit cell circuits 602(0,1) and 602(1,1). As described further below, in response to write operations, the binary weight data 206 corresponding to each of the activation signals 208 is stored in the CIM bit cell circuits 602 prior to a multiplication. The product data 212 from multiplications in each of the CIM bit cell circuits 602 in the column C0 or C1 is summed to complete the "accumulate" portion of the MAC operation.

Structural details of the CIM array circuit 600 are described with reference to FIG. 6. The rows R0 and R1 of the CIM array circuit 600 include corresponding activation lines 604(0) and 604(1), and corresponding write word lines 606(0) and 606(1). The activation line 604(0) is coupled to the activation inputs 210 of each of the CIM bit cell circuits 602 in the row R0, and the activation line 604(1) is coupled to the activation inputs 210 of each of the CIM bit cell circuits 602 in the row R1. The write word line 606(0) is coupled to the write word inputs 224 of each of the CIM bit cell circuits 602 in the row R0, and the write word line 606(1) is coupled to the write word inputs 224 of each of the CIM bit cell circuits 602 in the row R1.

The columns C0 and C1 include corresponding write bit lines 608(0) and 608(1) and corresponding read bit lines 610(0) and 610(1). The write bit line 608(0) is coupled to the write bit inputs 220 of each of the CIM bit cell circuits 602 in the column C0, and the write bit line 608(1) is coupled to the write bit inputs 220 of each of the CIM bit cell circuits 602 in the column C1. The read bit line 610(0) is coupled to the read bit outputs 216 of each of the CIM bit cell circuits 602 in the column C0, and the read bit line 610(1) is coupled to the read bit outputs 216 of each of the CIM bit cell circuits 602 in the column C1.

The CIM array circuit 600 includes summing circuits 612(0) and 612(1) coupled to the read bit lines 610(0) and 610(1), respectively. In a read operation, the product data 212 from each of the CIM bit cell circuits 602 in column C0 are accumulated on the read bit line 610(0). In particular, product voltages 214 indicating the results of the multiplications in of each of the CIM bit cell circuits 602(0,0) and 602(1,0) are supplied to the read bit line 610(0). Each of the CIM bit cell circuits 602 in a column generating the product data 212 as a binary "1" contributes to charging the read bit line 610(0), which increases a voltage of the read bit line 610(0), as follows. For one of the CIM bit cell circuits 602 in column C0 generating a product data 212 of binary "1", the voltage on the read bit line 610(0) can be determined according to the following equation:

$$V_{RBL} = V_{gg}(C_{gg}/(C_{gg}+C_{RBL})), \text{ where:}$$

$V_{RBL}$=voltage generated to the read bit line 610(0)
$V_{gg}$=voltage on the capacitor (e.g., 244) in the capacitive storage circuit 204 supplied from the write bit voltage 218
$C_{gg}$=capacitance of the capacitor 244 in the capacitive storage circuit 204
$C_{RBL}$=capacitance of the read bit line 610(0)

The summing circuit 612(0) may comprise, for example, a sense amplifier or an analog-to-digital converter (ADC) that generates a sum 614(0) indicating the number of "1"s in the column C0 charging the read bit line 610(0) depending on the voltage $V_{RBL}$. Similarly, the summing circuit 612(1) generates a sum 614(1) indicating the number of "1"s in the column C1 charging the read bit line 610(1). In this manner, the CIM array circuit 600 executes the multiplications and accumulations of a MAC operation for a neural network.

The capacitance $C_{RBL}$ of the read bit line 610(0) is very small compared to the capacitance $C_{gg}$ of the capacitor 244 in the capacitive storage circuit 204. Thus, charging the read bit line 610(0) to the product voltage 214 does not discharge the capacitor 244, so the binary weight data 206 is maintained on the capacitor 244 after the product data 212 is read. A read operation of the CIM bit cell circuits 602 in the CIM array 600 is therefore referred to as a non-destructive read operation.

Figure 7B:
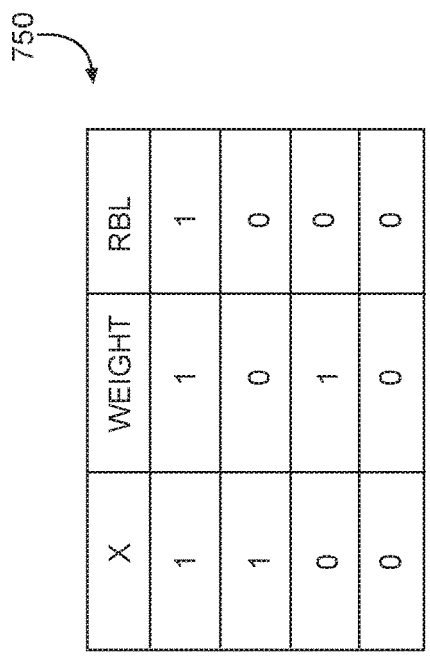
FIG. 7B is a truth table illustrating operation of the 2T CIM bit cell circuit of FIG. 7A.
Figure 7A:
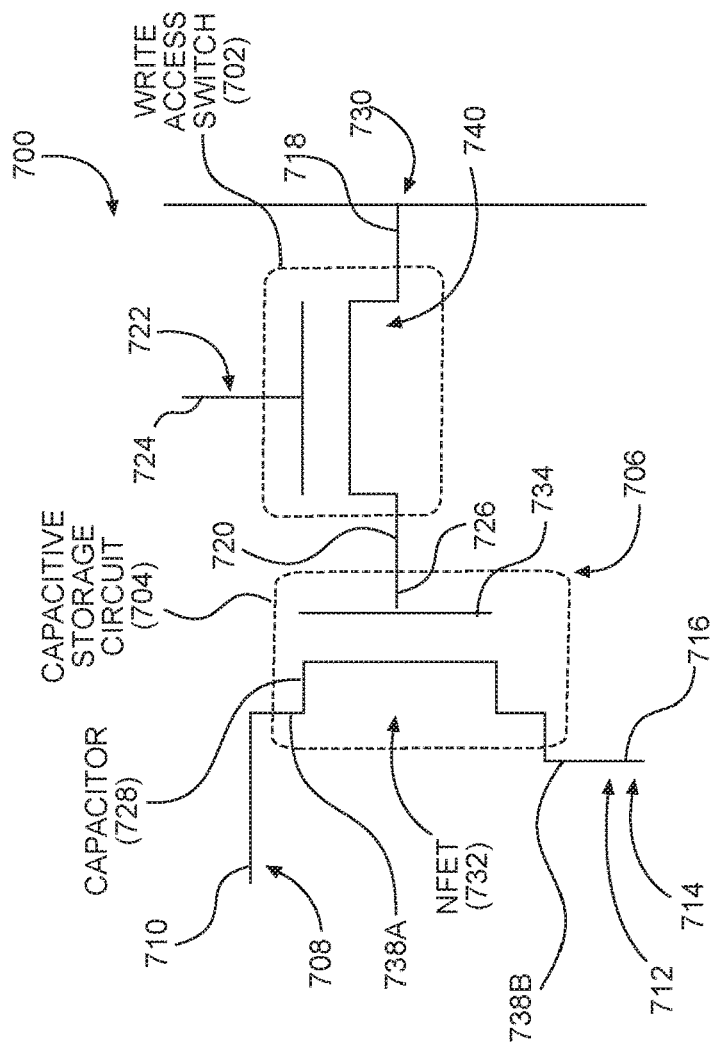
FIG. 7A is a schematic diagram of an exemplary 2T CII bit cell circuit based on a dynamic random-access memory (DRAM) bit circuit that includes a P-type MOSFET and a PMOS read access transistor in a capacitive storage circuit.

FIG. 7 is a schematic diagram of an exemplary CIM bit cell circuit 700, for performing binary multiplication in a MAC operation in a neural network (not shown), including a write access switch 702 for programming a capacitive storage circuit 704 with a binary weight data 706. As in the examples illustrated in FIGS. 2A and 3-5, the CIM bit cell circuit 700 receives an activation signal 708 on an activation input 710. A product data 712 of a binary multiplication (e.g., logical AND-based operation) of the activation signal 708 and the binary weight data 706 is generated as a product voltage 714 on a read bit output 716.

The write access switch 702 couples a write bit input 718 to a first port 720 of the capacitive storage circuit 704 in response to a write word voltage 722 on a write word input 724. The first port 720 of the capacitive storage circuit 704 is coupled to a first terminal 726 of a capacitor 728. The capacitor 728 is charged to store the binary weight data 706 based on a write bit voltage 730 supplied on the write bit input 718.

In contrast to the CIM bit cell circuit 200 of FIG. 2A, in which the capacitive storage circuit 204 includes both the capacitor 244 and the read access switch 246, the capacitive storage circuit 704 of the CIM bit cell circuit 700 employs only the capacitor 728, which is an NFET 732. The first terminal 726 of the capacitor 728 is a gate 734 of the NFET 732. The NFET 732 includes source/drain 738A and drain/source 738B. Here, rather than coupling both of the source/drain 738A and the drain/source 738B together, like the source/drain 262 and the drain/source 264, the source/drain 738A is coupled to the activation input 710, and the drain/source 738B is coupled to the read bit output 716. The product data 712 generated on the read bit output 716 is a binary result of a logical AND of the binary weight data 706 and the activation signal 708 supplied on the activation input 710. In particular, in response to the binary weight data 706 being a binary "1", in the case of the NFET 732, the activation input 710 is coupled to the read bit output 716, and the product data 712 takes the value of the activation signal 708.

The write access switch 702 in FIG. 7 is also an NFET 740. Thus, the CIM bit cell circuit 700 is capable of performing a multiply operation, like the CIM bit cell circuit 200 of FIG. 2A, but includes only 2 transistors (732 and 740) as opposed to the three-transistor (3T) CIM bit cell circuit 200 in FIG. 2A or the two-transistors (2T) and one capacitor (1C) (2T1C) CIM bit cell circuit 400 in FIG. 4. In this regard, an area occupied by the CIM bit cell circuit 700 is less than half of an area occupied by previous CIM bit cell circuits employing 6T SRAMs. A truth table 750 illustrates the logical AND-based operation of the CIM bit cell circuit 700, which is the same as the truth table 270 in FIG. 2B.

Figure 8B:
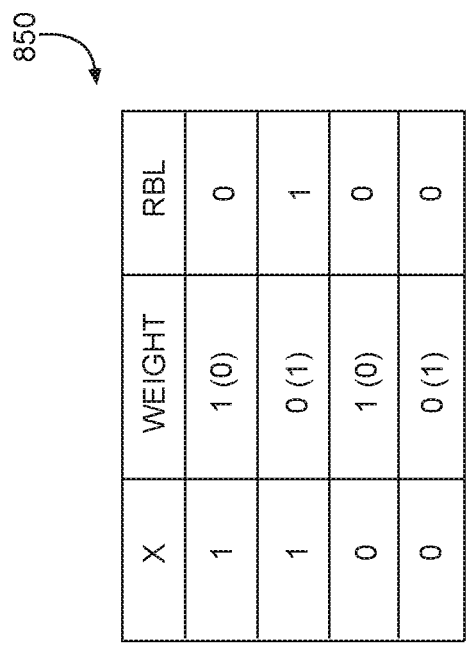
FIG. 8B is a truth table illustrating operation of the 2T CIM bit cell circuit of FIG. 8A.
Figure 8A:
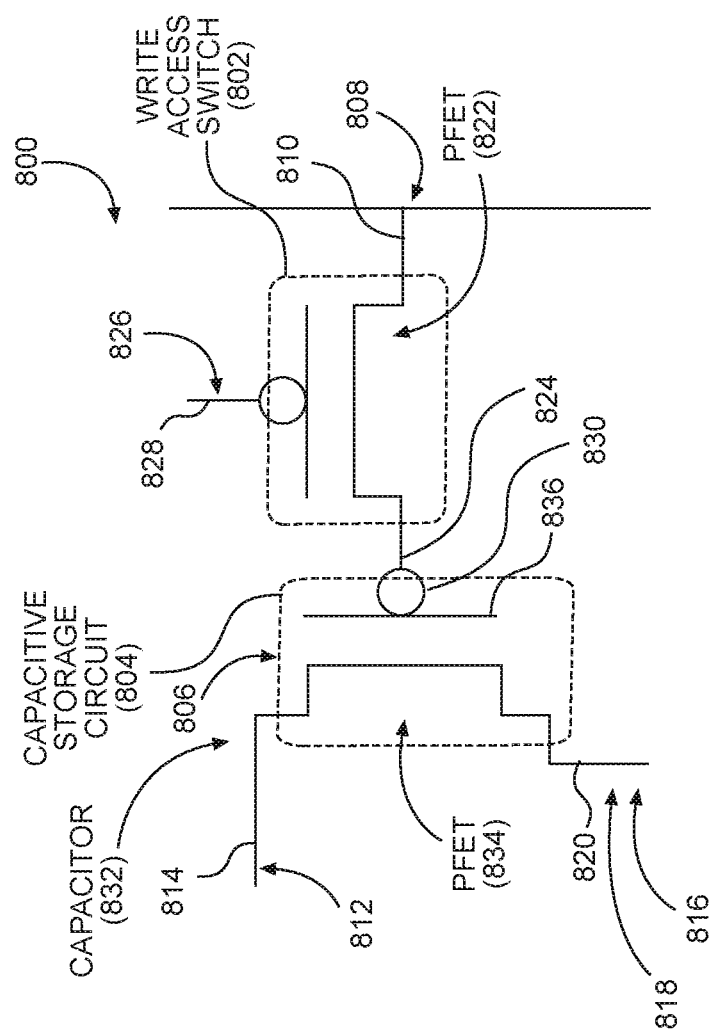
FIG. 8A is a schematic diagram of an exemplary 2T CIM bit cell circuit that includes an N-type MOSFET and an NMOS read access transistor in a capacitive storage circuit.

In another example, FIG. 8 is a schematic diagram of an exemplary CIM bit cell circuit 800 for binary multiplication including a write access switch 802 for programming a capacitive storage circuit 804 with a binary weight data 806 based on a write bit voltage 808 supplied on a write bit input 810. As in the CIM bit cell circuit 700 of FIG. 7, the CIM bit cell circuit 800 is a 2T circuit. The CIM bit cell circuit 800 receives an activation signal 812 on an activation input 814 to read a product data 816. The product data 816 is a product of a binary multiplication (e.g., logical AND-based operation) of the activation signal 812 and the binary weight data 806. The product data 816 is generated as a product voltage 818 on a read bit output 820.

In contrast to the CIM bit cell circuit 700, the write access switch 802 employs a PFET 822 as the write access switch 802 to couple the write bit input 810 to a first port 824 of the capacitive storage circuit 804 in response to a write word voltage 826 on a write word input 828. The first port 824 of the capacitive storage circuit 804 is coupled to a first terminal 830 of a capacitor 832 provided by a PFET 834. The first terminal 830 is a gate 836 of the PFET 834. The capacitor 832 is charged to store the binary weight data 806 based on the write bit voltage 808 supplied on the write bit input 810. The write access switch 802, provided by the PFET 822, couples the write bit input 810 to the first port 824 of the capacitive storage circuit 804 in response to the write word voltage 826 being the ground voltage $V_{SS}$ (e.g., 0 volts), which is opposite in polarity to the write word voltage 722 supplied to the write word input 724 in FIG. 7.

Furthermore, the PFET 834 in the capacitive storage circuit 804 couples the activation input 814 to the read bit output 820 in response to the binary weight data 806 being the ground voltage $V_{SS}$. In this regard, the binary weight data 806 stored in the CIM bit cell circuit 800 must be opposite in polarity to the binary weight data 706 in the CIM bit cell circuit 700 to cause the PFET 834 to turn on. Thus, binary weight data 806 of the CIM bit cell circuit 800 is opposite in polarity to the binary weight data 706 of FIG. 7. The logical AND-based operation of the CIM bit cell circuit 800 is illustrated in a truth table 850 in FIG. 8. The truth table 850 shows that the product data 816 is the logical AND of the activation signal 812 and also shows the inverse (in parentheses) of the binary weight data 806. Like the CIM bit cell circuit 700, an area occupied by the CIM bit cell circuit 800 is less than half of an area occupied by previous CIM bit cell circuits employing 6T SRAMs.

Figure 9:
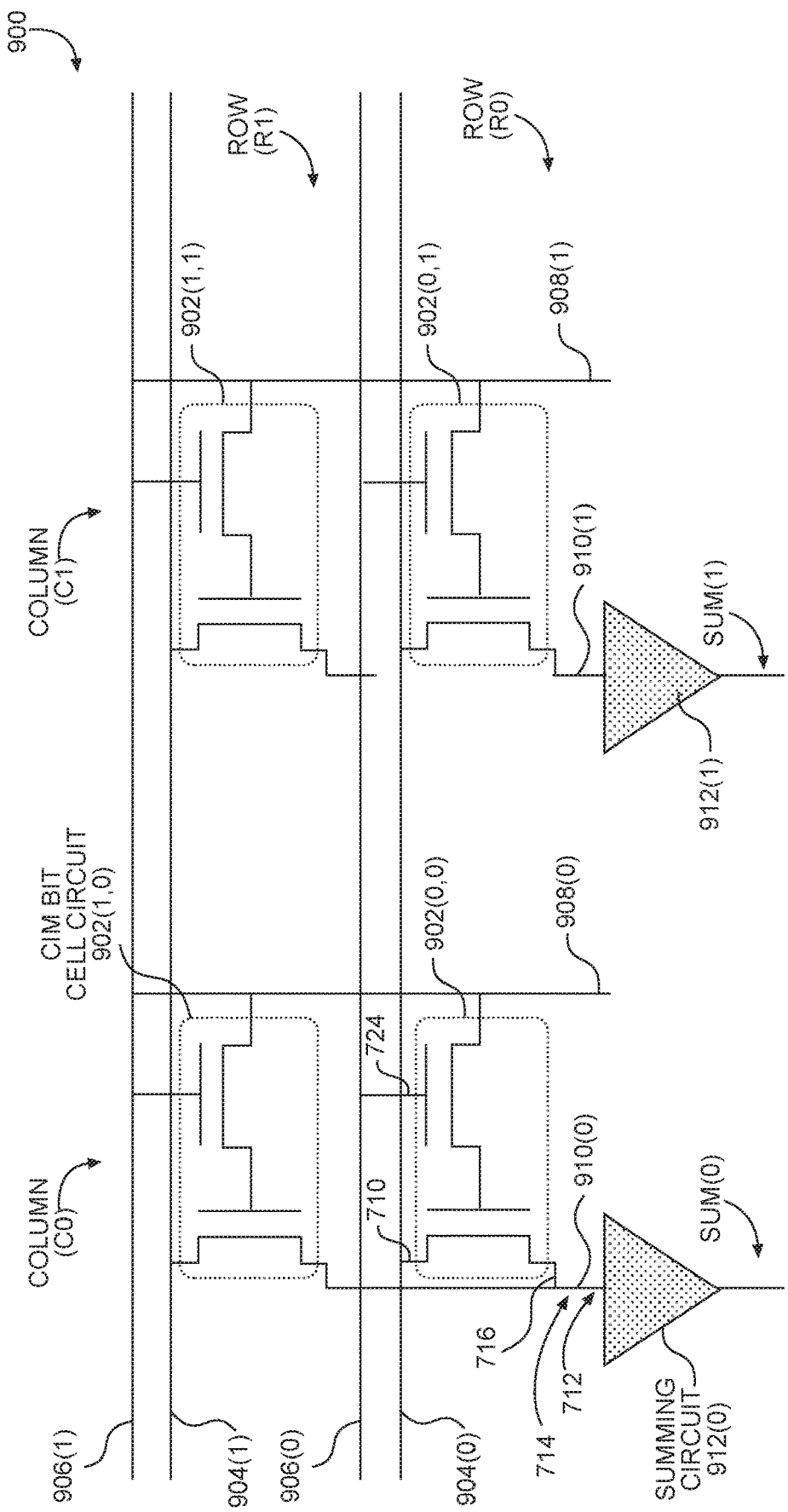
FIG. 9 is a schematic diagram of a 2×2 array of a plurality of the 2T CIM bit cell circuit in FIG. 8 including summing circuits in each column of the 2×2 array.

FIG. 9 is a schematic diagram of a CIM bit cell array circuit (CIM array circuit) 900 of CIM bit cell circuits 902(0,0)-902(1,1), referred to collectively as CIM bit cell circuits 902. The CIM bit cell circuits 902 in the CIM array circuit 900 are the CIM bit cell circuit 700 in FIG. 7 and the labels of FIG. 7 are referred to in regard to features of the CIM bit cell circuits 902. Thus, each of the CIM bit cell circuits 902 includes an activation input 710, a write bit input 718, a write word input 724 and a read bit output 716. Each of the CIM bit cell circuits 902 stores a binary weight data 706 as described in FIG. 7.

The CIM array circuit 900 includes row a R0 with CIM bit cell circuits 902(0,0) and 902(0,1), and a row R1 with CIM bit cell circuits 902(1,0) and 902(1,1). The CIM array circuit 900 also includes a column C0 with CIM bit cell circuits 902(0,0) and 902(1,0), and a column C1 with CIM bit cell circuits 902(0,1) and 902(1,1). As described further below, in response to write operations, the binary weight data 706 corresponding to each of the activation signals 708 is stored in the CIM bit cell circuits 902 prior to a multiplication. The product data 712 from multiplications in each of the CIM bit cell circuits 902 in the column C0 or C1 is summed to complete the "accumulate" portion of the MAC operation.

The rows R0 and R1 include activation lines 904(0) and 904(1) coupled to the activation inputs 710 of the CIM bit cell circuits 902 in the corresponding row. The rows R0 and R1 also include write word lines 906(0) and 906(1) coupled to the write word inputs 724 of the CIM bit cell circuits 902 in the corresponding row. The columns C0 and C1 include write bit lines 908(0) and 908(1) coupled to the write bit inputs 718 of the CIM bit cell circuits 902 in the corresponding column. The columns C0 and C1 also include read bit lines 910(0) and 910(1) coupled to the read bit outputs 716 of the CIM bit cell circuits 902 in the corresponding column.

Writing the binary weight bit data 706 to the CIM bit cell circuits 902 is the same as described above with regard to writing the binary weight data 206 in the CIM bit cell circuits 602 in the CIM array circuit 600 of FIG. 6. However, due to the difference in structure between the capacitive storage circuit 204 in FIG. 2 and the capacitive storage circuit 704 in FIG. 7, the operation of reading the product data 712 from the respective CIM bit cell circuits 902 is different than reading the CIM bit cell circuits 602 in the CIM array circuit 600.

The columns C0 and C1 include summing circuits 912(0), 912(1) to determine how many of the CIM bit cell circuits 902 in one of the columns C0 and C1 of the CIM array circuit 900 are storing binary weight data 706 having a value of binary "1". The activation signal 708 is supplied on the activation line 904(0) to generate the product voltage 714 on the read bit output 716 of a particular one of the CIM bit cell circuits 902. In the case of the CIM bit cell circuits 700 and 800, the activation signal 708 is the supply voltage $V_{DD}$ or the ground voltage $V_{SS}$ and is not based on the charge sharing equation discussed above with regard to FIG. 6. Therefore, a read operation is performed one by one in sequence on each of the CIM bit cell circuits 902 in, for example, the column C0. The summing circuit 912(0) in column C0 senses the product voltage 714 at a time corresponding to each read operation to determine whether the binary weight data 706 stored in a CIM bit cell circuit 902 is a binary "1" or "0", and adds the number of "1"s sensed in the column. Thus, an additional tradeoff for the reduction in area provided by an array formed of the CIM bit cell circuit 700, such as the CIM array circuit 900, is that more cycles are needed to read the product data 712 from all the CIM bit cell circuits 902 in a column, which increases an execution time of a MAC operation. As in the CIM array circuit 600, a read operation in the CIM array circuit 900 is non-destructive, the binary weight data 706 needs to be periodically or occasionally refreshed, and a particular CIM bit cell circuit 902 can be refreshed at the same time as (e.g., simultaneously with) the product data 712 being read in a read operation.

Figure 10:
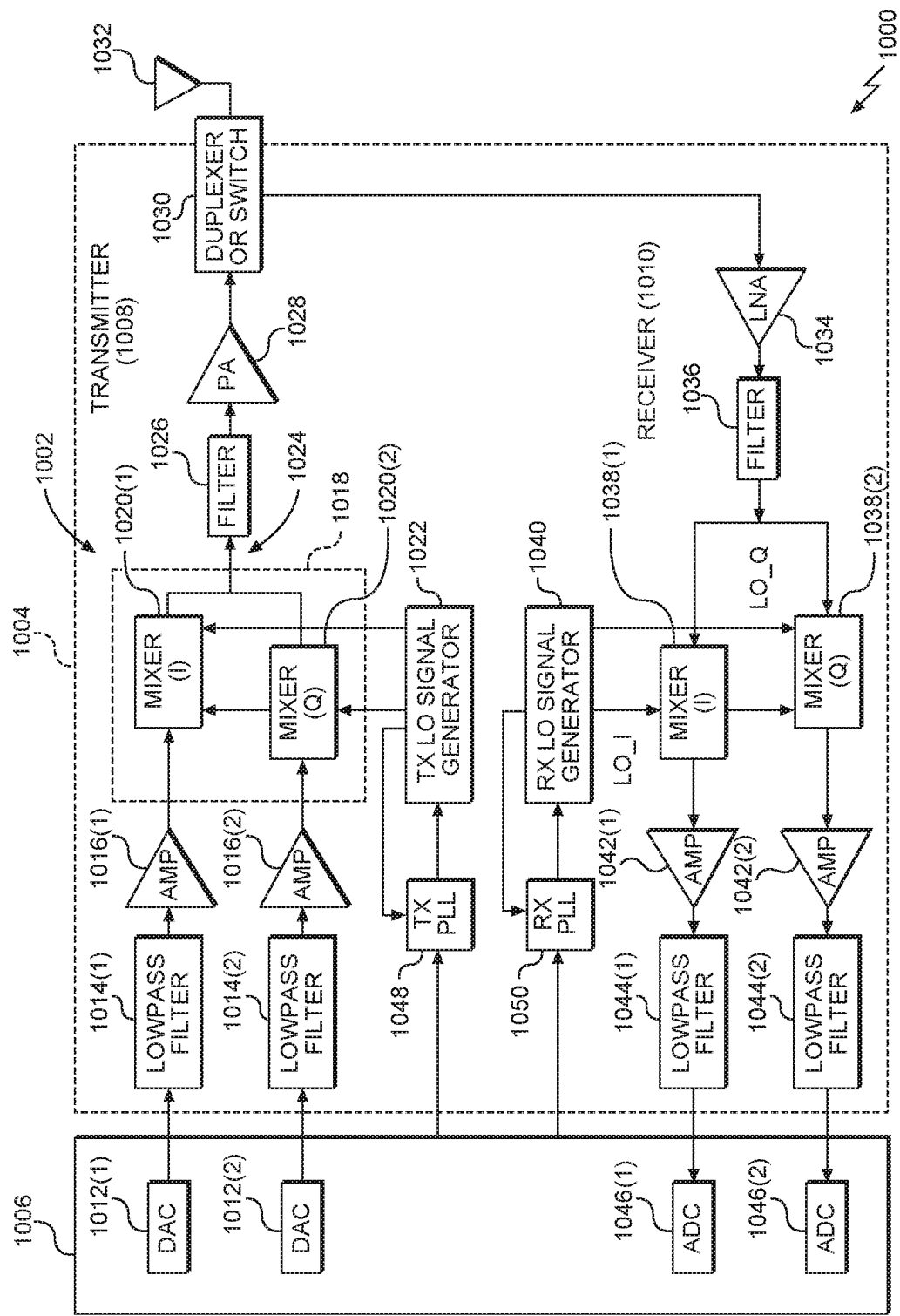
FIG. 10 is a block diagram of an integrated circuit in which is integrated a CIM bit cell array circuit as illustrated in any of FIGS. 6 and 9.

FIG. 10 illustrates an exemplary wireless communications device 1000 that includes radio frequency (RF) components 1002, wherein one or more RF components 1002 may be in the form of ICs, wherein any of the RF components 1002 can include a CIM bit cell array circuit, as illustrated in any of FIGS. 6 and 9, including CIM bit cell circuits that provide capacitive charge-based data storage and perform a binary multiplication in half or less of the area of a 6T SRAM bit cell circuit, as illustrated in any of FIGS. 2A, 3-5, 7, and 8, and according to any of the aspects disclosed herein. The wireless communications device 1000 may include or be provided in any of the above-referenced devices, as examples. As shown in FIG. 10, the wireless communications device 1000 includes a transceiver 1004 and a data processor 1006. The data processor 1006 may include a memory to store data and program codes. The transceiver 1004 includes a transmitter 1008 and a receiver 1010 that support bi-directional communications. In general, the wireless communications device 1000 may include any number of transmitters 1008 and/or receivers 1010 for any number of communication systems and frequency bands. All or a portion of the transceiver 1004 may be implemented on one or more analog ICs, RFICs, mixed-signal ICs, etc.

The transmitter 1008 or the receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1010. In the direct-conversion architecture, a signal is frequency-converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog converters (DACs) 1012(1), 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired signals caused by the prior digital-to-analog conversion. Amplifiers (AMPs) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired signals caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific receive (RX)-to-TX duplexer frequency separation, such that RX signals are isolated from TX signals. The received RF signal is amplified by the LNA 1034 and filtered by a filter 1036 to obtain a desired RF input signal. Downconversion mixers 1038(1), 1038(2) mix the output of the filter 1036 with I and Q RX LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes ADCs 1046(1), 1046(2) for converting the analog input signals into digital signals to be further processed by the data processor 1006.

In the wireless communications device 1000 of FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A TX phase-locked loop (PLL) circuit 1048 receives timing information from the data processor 1006 and generates a control signal used to adjust the frequency and/or phase of the TX LO signals from the TX LO signal generator 1022. Similarly, an RX PLL circuit 1050 receives timing information from the data processor 1006 and generates a control signal used to adjust the frequency and/or phase of the RX LO signals from the RX LO signal generator 1040.

Wireless communications devices 1000 that each include a CIM bit cell array circuit, as illustrated in any of FIGS. 6 and 9, including CIM bit cell circuits that provide capacitive charge-based data storage and perform a binary multiplication in half or less of the area of a 6T SRAM bit cell circuit, as illustrated in any of FIGS. 2A, 3-5, 7, and 8, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
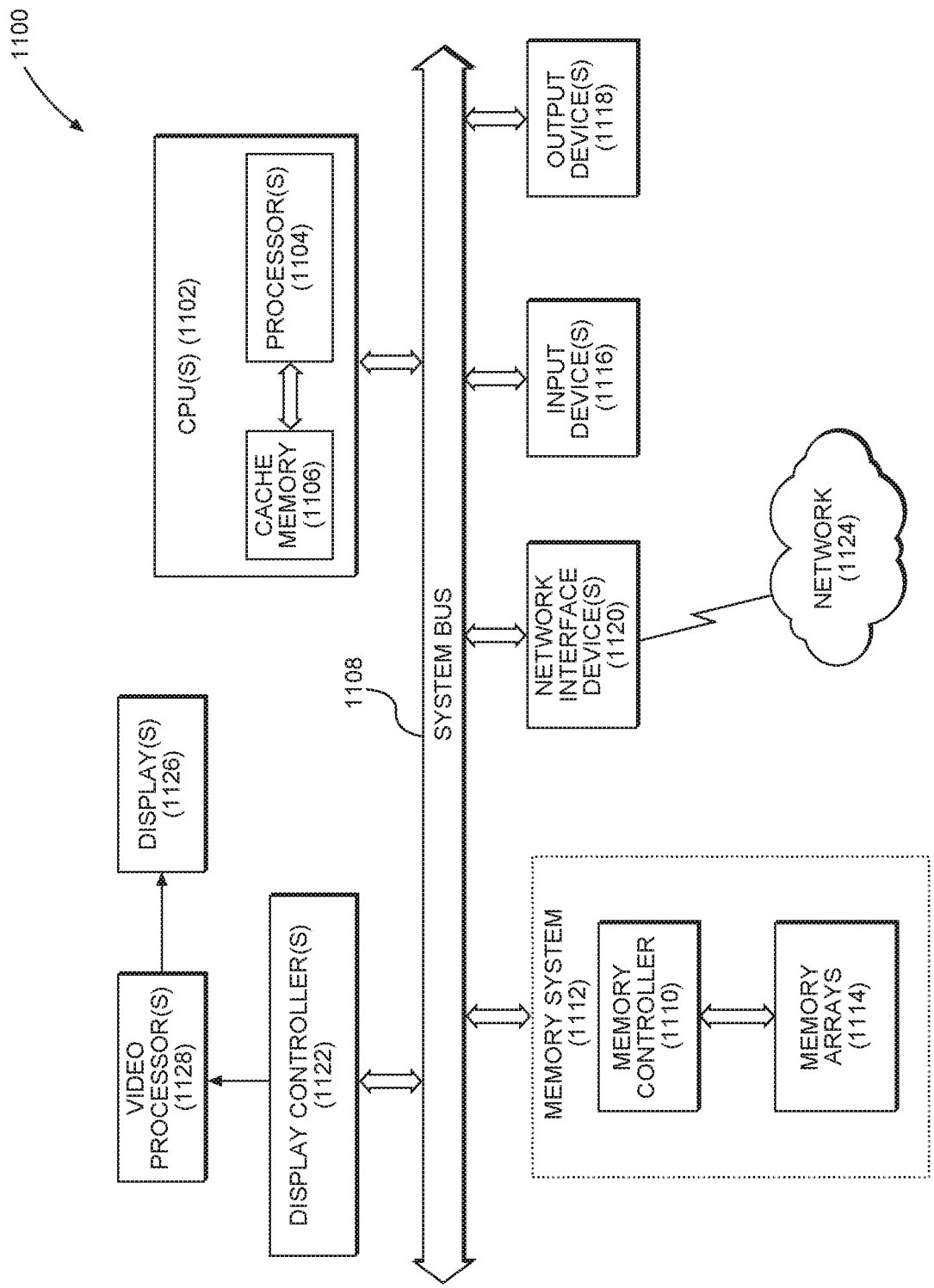
FIG. 11 is a block diagram of an exemplary processor-based system that includes a CIM bit cell array circuit of the CIM bit cell circuits in FIGS. 2-5 and 7-8 that each include a capacitive storage circuit and are configured to store a weight data and generate a logical product (AND-based operation) of an input data bit and the stored weight data, as illustrated in any of FIGS. 6 and 9, and according to any of the aspects disclosed herein.

In this regard, FIG. 11 illustrates an example of a processor-based system 1100 including a CIM bit cell array circuit, as illustrated in any of FIGS. 6 and 9, including CIM bit cell circuits that provide capacitive charge-based data storage and perform a binary multiplication in half or less of the area of a 6T SRAM bit cell circuit, as illustrated in any of FIGS. 2A, 3-5, 7, and 8, and according to any aspects disclosed herein. In this example, the processor-based system 1100 includes one or more central processor units (CPUs) 1102, which may also be referred to as CPU or processor cores, each including one or more processors 1104. The CPU(s) 1102 may have cache memory 1106 coupled to the processor(s) 1104 for rapid access to temporarily stored data. As an example, the processor(s) 1104 could include an SRAM bit cell array including minimized inactive bit cell areas, minimized inactive array areas, and gate contacts overlapping storage circuit active areas to reduce a length of the array, as illustrated in any of FIGS. 4 and 8, and according to any aspects disclosed herein. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112 that includes the memory controller 1110 and one or more memory arrays 1114, one or more input devices 1116, one or more output devices 1118, one or more network interface devices 1120, and one or more display controllers 1122, as examples. Each of the memory system 1112, the one or more input devices 1116, the one or more output devices 1118, the one or more network interface devices 1120, and the one or more display controllers 1122 can include a CIM bit cell array circuit, as illustrated in any of FIGS. 6 and 9, including CIM bit cell circuits that provide capacitive charge-based data storage and perform a binary multiplication in half or less of the area of a 6T SRAM bit cell circuit, as illustrated in any of FIGS. 2A, 3-5, 7, and 8, and according to any of the aspects disclosed herein. The input device(s) 1116 can include any type of input device, including, but not limited to, input keys, switches, voice processors, etc. The output device(s) 1118 can include any type of output device, including, but not limited to, audio, video, other visual indicators, etc. The network interface device(s) 1120 can be any device configured to allow exchange of data to and from a network 1124. The network 1124 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc. The display controller(s) 1122, display(s) 1126, and/or the video processor(s) 1128 can include a CIM bit cell array circuit, as illustrated in any of FIGS. 6 and 9, including CIM bit cell circuits that provide capacitive charge-based data storage and perform a binary multiplication in half or less of the area of a 6T SRAM bit cell circuit, as illustrated in any of FIGS. 2A, 3-5, 7, and 8, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A compute-in-memory (CIM) bit cell circuit comprising:
   a write access switch comprising:
      an input terminal coupled to a write bit input;
      a control terminal coupled to a write word input; and
      an output terminal;
      the write access switch configured to couple the write bit input to the output terminal in response to a write word voltage supplied to the write word input; and
   a capacitive storage circuit comprising:
      a first port coupled to the output terminal of the write access switch;
      a second port coupled to a read bit output; and
      a metal-oxide semiconductor (MOS) Field-Effect Transistor (FET) (MOSFET):
   wherein:
      the first port of the capacitive storage circuit is coupled to a gate of the MOSFET;
      the second port of the capacitive storage circuit comprises a source/drain of the MOSFET coupled to the read bit output;

the MOSFET further comprises a third port comprising a drain/source coupled to an activation input; and the capacitive storage circuit is configured to:
store a weight data based on a write bit voltage supplied on the write bit input in response to the write word voltage supplied to the write word input; and
generate a product voltage on the read bit output based on an activation signal and the stored weight data.

2. The CIM bit cell circuit of claim 1, wherein the MOSFET further comprises a P-type FET (PFET).

3. The CIM bit cell circuit of claim 1, wherein the MOSFET further comprises an N-type FET (NFET).

4. The CIM bit cell circuit of claim 1, wherein the write access switch comprises a transistor.

5. The CIM bit cell circuit of claim 4, wherein the write access switch comprises a P-type Field-Effect Transistor (PFET).

6. The CIM bit cell circuit of claim 4, wherein the write access switch comprises an N-type Field-Effect Transistor (NFET).

7. The CIM bit cell circuit of claim 1, wherein the capacitive storage circuit is further configured to couple the activation input to the read bit output.

8. A compute-in-memory (CIM) bit cell array circuit comprising an array of CIM bit cell circuits, the array of CIM bit cell circuits comprising a plurality of rows of CIM bit cell circuits and a plurality of columns of CIM bit cell circuits, wherein:

each row of the plurality of rows comprises a corresponding activation line coupled to an activation input in each of the CIM bit cell circuits in the row and a corresponding write word line coupled to a write word input in each of the CIM bit cell circuits in the row;

each column of the plurality of columns comprises a corresponding write bit line coupled to a write bit input in each of the CIM bit cell circuits in the column and a corresponding read bit line coupled to a read bit output in each of the CIM bit cell circuits in the column; and each of the CIM bit cell circuits comprises:
a write access switch comprising:
an input terminal coupled to the write bit input;
a control terminal coupled to the write word input; and
an output terminal; and
a capacitive storage circuit comprising:
a first port coupled to the output terminal of the write access switch;
a second port coupled to the read bit output; and
a metal-oxide semiconductor (MOS) Field-Effect Transistor (FET) (MOSFET);
wherein:
the first port of the capacitive storage circuit is coupled to a gate of the MOSFET;
the second port of the capacitive storage circuit comprises a source/drain of the MOSFET coupled to the read bit output;
the MOSFET further comprises a third port comprising a drain/source coupled to the activation input; and the capacitive storage circuit is configured to:
store a weight data based on a write bit voltage supplied on the write bit input in response to a write word voltage supplied to the write word input; and
generate a product voltage on the read bit output based on an activation signal and the stored weight data.

9. The CIM bit cell array circuit of claim 8, wherein the capacitive storage circuit is further configured to couple the activation input to the read bit output.

10. The CIM bit cell array circuit of claim 8, further configured to,
in response to:
the write bit line in a first column of the plurality of columns of CIM bit cell circuits supplying the write bit voltage; and
the write word line in a first row of the plurality of rows of CIM bit cell circuits supplying the write word voltage,
store the weight data based on the write bit voltage in the capacitive storage circuits of the CIM bit cell circuits in the first column of the plurality of columns and the first row of the plurality of rows.

11. The CIM bit cell array circuit of claim 8, further configured to:
generate a read sum voltage on the read bit line of a second column of the plurality of columns based on the weight data stored in the capacitive storage circuits of the CIM bit cell circuits in the second column and the activation signals on the activation lines in the plurality of rows; and
generate, in a summing circuit, a sum indicating the read sum voltage, wherein the sum comprises an analog signal or a digital signal.

12. The CIM bit cell array circuit of claim 8 integrated into an integrated circuit (IC).

13. The CIM bit cell array circuit of claim 8 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

\* \* \* \* \*